US009335600B2

(12) United States Patent
Lee et al.

(10) Patent No.: US 9,335,600 B2
(45) Date of Patent: May 10, 2016

(54) LIQUID CRYSTAL DISPLAY DEVICE AND METHOD FOR FABRICATING THE SAME

(71) Applicant: LG DISPLAY CO., LTD., Seoul (KR)

(72) Inventors: Byung-Hyun Lee, Paju-si (KR); Min-Jic Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 445 days.

(21) Appl. No.: 13/727,166

(22) Filed: Dec. 26, 2012

(65) Prior Publication Data

US 2013/0342781 A1    Dec. 26, 2013

(30) Foreign Application Priority Data

Jun. 25, 2012   (KR) .................. 10-2012-0068222

(51) Int. Cl.
 G02F 1/1343        (2006.01)
 G02F 1/1339        (2006.01)
 (Continued)

(52) U.S. Cl.
 CPC .......... G02F 1/1368 (2013.01); G02F 1/13394 (2013.01); G02F 1/136259 (2013.01); H01L 27/124 (2013.01); H01L 29/41733 (2013.01); H01L 33/58 (2013.01); *G02F 1/136213* (2013.01); *G02F 1/136286* (2013.01);
 (Continued)

(58) Field of Classification Search
 CPC ............. G02F 1/1368; G02F 1/13394; G02F 1/136259; G02F 1/136213; G02F 2001/134318; G02F 2001/134372; G02F 2001/13606; G02F 2001/136239; G02F 2201/40; H01L 33/58; H01L 29/41733; H01L 27/124

USPC ............................ 349/43, 141, 143, 155, 156
See application file for complete search history.

(56) References Cited

U.S. PATENT DOCUMENTS

| 6,927,808 B2 * | 8/2005 | Ono ................... G02F 1/134363 349/141 |
| 7,518,695 B2 * | 4/2009 | Cho .................... G02F 1/13394 349/155 |

(Continued)

FOREIGN PATENT DOCUMENTS

| CN | 102346342 A | 2/2012 |
| KR | 10-2008-0074606 A | 8/2008 |

(Continued)

OTHER PUBLICATIONS

Notice of Allowance issued in Korean Patent Application No. 10-2012-0068222, mailed Apr. 24, 2014, 2 pages.

(Continued)

*Primary Examiner* — Edward Glick
*Assistant Examiner* — David Chung
(74) *Attorney, Agent, or Firm* — Brinks Gilson & Lione

(57) ABSTRACT

The present disclosure relates to a liquid crystal display device and a fabricating method thereof. The liquid crystal display device includes: first and second substrates bonded to each other; gate lines aligned on the first substrate; a data line and a common line on the first substrate; a large pixel electrode disposed at the intersecting point between the lines; a TFT at the intersecting point between the gate line and the data line; a protrusion pattern on the gate line; a passivation layer on the first substrate; branched common electrodes on the passivation layer; a pixel electrode connection pattern on the passivation layer; a black matrix and color filter layer on the second substrate; a column spacer on the second substrate; and a liquid crystal layer at between the substrates.

13 Claims, 14 Drawing Sheets

(51) Int. Cl.
*G02F 1/136* (2006.01)
*G02F 1/1368* (2006.01)
*H01L 33/58* (2010.01)
*H01L 29/417* (2006.01)
*H01L 27/12* (2006.01)
*G02F 1/1362* (2006.01)

(52) U.S. Cl.
CPC ............... *G02F2001/13606* (2013.01); *G02F 2001/134318* (2013.01); *G02F 2001/134372* (2013.01); *G02F 2001/136236* (2013.01); *G02F 2201/40* (2013.01)

(56) References Cited

U.S. PATENT DOCUMENTS

| | | | | |
|---|---|---|---|---|
| 7,557,891 B2* | 7/2009 | Yoon | | G02F 1/13394 349/141 |
| 7,684,003 B2* | 3/2010 | Paik | | G02F 1/13394 257/E21.02 |
| 7,701,544 B2* | 4/2010 | Yang | | G02F 1/13394 349/155 |
| 8,477,282 B2* | 7/2013 | Shim | | G02F 1/13394 349/155 |
| 2007/0023760 A1* | 2/2007 | Kim | | G02F 1/136213 257/72 |
| 2007/0153215 A1* | 7/2007 | Lee | | G02F 1/13394 349/156 |
| 2009/0040444 A1 | 2/2009 | Tsuchiya et al. | | |
| 2009/0225250 A1* | 9/2009 | Lyu et al. | | 349/44 |
| 2009/0289260 A1* | 11/2009 | Sonoda et al. | | 257/72 |
| 2010/0066933 A1* | 3/2010 | Oh | | G02F 1/134363 349/38 |
| 2011/0133194 A1* | 6/2011 | Liu et al. | | 257/59 |
| 2012/0113347 A1* | 5/2012 | Shim | | 349/43 |

FOREIGN PATENT DOCUMENTS

| | | |
|---|---|---|
| KR | 1020090092430 A | 9/2009 |
| KR | 1020090099287 A | 9/2009 |
| KR | 1020120038846 A | 4/2012 |
| KR | 1020120061540 A | 6/2012 |

OTHER PUBLICATIONS

Office Action dated Jul. 3, 2015 for corresponding Chinese Patent Application No. 201210568010.6, 5 pages.

* cited by examiner

LIQUID CRYSTAL DISPLAY DEVICE AND METHOD FOR FABRICATING THE SAME

CROSS-REFERENCE TO RELATED APPLICATION

This application claims the benefit of Korean Patent Application No. 10-2012-0068222, filed on Jun. 25, 2012, which is hereby incorporated by reference for all purposes as if fully set forth herein.

BACKGROUND

1. Field of the Disclosure

This specification relates to a Liquid Crystal Display (LCD) device, and particularly, to an LCD device having a varied structure of a drain electrode and a fabricating method thereof.

2. Background

In general, the driving principle of a liquid crystal display (LCD) device uses an optical anisotropy and polarization properties of liquid crystal. Liquid crystals have a thin, long structure, so they have orientation in an alignment of molecules, and the direction of the alignment of molecules can be controlled by intentionally applying an electric field to the liquid crystal.

Thus, when the direction of the alignment of molecules of the liquid crystal is adjusted, the alignment of molecules of the liquid crystal can be changed, and light is refracted in the direction of the molecular alignment of the liquid crystal by optical anisotropy, thus displaying image information.

Currently, an active matrix liquid crystal display (AM-LCD) (which will be referred to as an 'LCD', hereinafter) in which thin film transistors (TFTs) and pixel electrodes connected to the TFTs are arranged in a matrix form has come to prominence because of its excellent resolution and video implementation capabilities.

The LCD includes a color filter substrate (i.e., an upper substrate) on which common electrodes are formed, an array substrate (i.e., a lower substrate) on which pixel electrodes are formed, and liquid crystal filled between the upper substrate and the lower substrate. In the LCD, the common electrode and the pixel electrodes drive liquid crystals by an electric field applied vertically, having excellent characteristics of transmittance, aperture ratio, and the like.

However, the driving of liquid crystals by the electric field applied vertically is disadvantageous in that viewing angle characteristics are not good. Thus, in order to overcome the shortcomings, a method for driving liquid crystal by in-plane switching has been newly proposed. The method for driving liquid crystal by the in-plane switching has excellent viewing angle characteristics.

Although not shown, in the in-plane switching mode LCD is configured such that a color filter substrate and an array substrate face each other, and a liquid crystal is interposed therebetween.

On the array substrate, a TFT, a common electrode, and a pixel electrode are formed on each of a plurality of pixels defined on the TFT substrate. Here, the common electrode and the pixel electrode are spaced apart from each other in parallel on the same substrate.

The color filter substrate includes black matrixes at portions, which correspond to gate lines and data lines formed on the TFT substrate, and the TFTs formed on intersecting points between the data and gate lines, and color filters corresponding to the pixels.

The liquid crystal layer is driven by a horizontal electric field of the common electrode and the pixel electrode.

In the in-plane switching mode LCD device configured as described above, the common electrode and the pixel electrode are formed as transparent electrodes in order to secure luminance.

A Fringe Field Switching (FFS) technique has been proposed to maximize the luminance improvement effect. The FFS technique precisely controls liquid crystal to eliminate a color shift and obtain high contract ratio, implementing high screen quality compared with the general in-plane switching technique.

Also, as a structure for preventing a reduction of transmittance, a Dual Rate Driving (DRD) structure employing the FFS mode has been currently proposed. This structure is a structure in which a conventional gate common line formed in a horizontal direction is removed and a common line is formed vertical to the gate line by using a metal layer for forming a data line.

An open area which is not covered by a black matrix (BM) is designed equally on left and right pixels based on a data line, preventing a perceptual error generated by a luminance difference between the left and right pixels due to shifting of the black matrix.

In addition, when overlapping portions between metal layers for forming the gate line and the data line are shifted due to process variation, storage capacitor (Cgs) values of the left and right pixels are different from each other. The left and right pixels thereby exhibit different luminance from each other, causing a perceptual error. To overcome such defect, a technique of forming a parasitic capacitor (Cgs) compensation pattern on each gate line has been proposed.

From this perspective, a DRD type LCD device employing the conventional FFS mode will be described with reference to FIGS. 1 and 2.

FIG. 1 is a planar view of an FFS type LCD device according to the related art.

FIG. 2 is a sectional view taken along the line II-II of FIG. 1, which shows the FFS type LCD device according to the related art.

An FFS type LCD device according to the related art, as shown in FIGS. 1 and 2, includes a first substrate 11 and a second substrate 31 bonded to each other with a spaced distance therebetween; a plurality of gate lines 15A and 15B aligned on the first substrate 11 in one direction in parallel to each other; a gate electrode 15a extending from each of the gate lines 15A and 15B; a gate insulating layer 17 formed on an entire surface of the substrate having the gate electrode 15a; a data line 23 and a common line 23d formed on the gate insulating layer 17 to define pixel regions at perpendicularly intersecting points with the gate lines 15A and 15B; a large pixel electrode 13 disposed on the pixel region defined at the intersecting point between each of the gate lines 15A and 15B and the data line 23 and the common line 23d; a Thin Film Transistor (TFT) T disposed at the intersecting point between each of the gate lines 15A and 15B and the data line 23, and having an active layer 19 disposed on the gate electrode 15a and the gate insulating layer 17, an Ohmic contact layer 21 on the active layer 19, and a source electrode 23a and a drain electrode 23b spaced apart from each other; a protrusion pattern 23c formed on the gate line 15B of the gate lines 15A and 15B; a passivation layer 25 formed on an entire surface of the first substrate 11 having the protrusion pattern 23c, and exposing the pixel electrode 13; a plurality of branched common electrodes 29a formed on the passivation layer 25 to be connected to the common line 23d and overlap the pixel electrode 13a; a pixel electrode connection pattern 29b to connect the pixel electrode 13 to the drain electrode 23b via the exposed passivation layer 29b; a black matrix 33 formed on the second substrate 31; a color filter layer 35 located between the black matrixes 33; a column spacer 37 formed on the second substrate 31 corresponding to the protrusion pattern 23c so as to contact the protrusion pattern 23c; and a liquid crystal layer 41 disposed between the first substrate 11 and the second substrate 31.

The protrusion pattern 23c is formed on the gate line 15A or the adjacent gate line 15B to overcome touch and gravity influences generated by a contact area between the TFT and the column spacer 37 formed on the second substrate 31.

FIG. 3 is an enlarged planar view of a TFT unit, corresponding to a part "A" in FIG. 1, which schematically shows the protrusion pattern, which is formed on the gate line to be adjacent to the straight drain electrode, and the black matrix.

Especially, FIG. 3 shows a case where a black matrix 33a having a first area A1 overlaps a non-pixel region to maintain the existing open area as it is, namely, a case where the protrusion patter 23c is formed on the gate line 15A.

Here, since the protrusion pattern 23c is formed as the same metal layer as the drain electrode 23b, the protrusion pattern 23c and the drain electrode 23b are disposed with an extremely narrow distance d1 therebetween, which is shorter than about 0.7 μm.

As the protrusion pattern 23c and the drain electrode 23b formed of the same metal layer are disposed with the extremely narrow distance d1, it is highly likely to cause the protrusion pattern 23c and the drain electrode 23b to be shorted from each other.

FIG. 4 is an enlarged planar view of the TFT unit, corresponding to the part "A" in FIG. 1, which schematically shows the protrusion pattern formed on the lower gate line and the black matrix.

Especially, FIG. 4 shows that the protrusion pattern 23c is formed on the lower gate line 15B, other than on the upper gate line 15A, to prevent the protrusion pattern 23c and the drain electrode 23b from being shorted from each other.

Here, as the protrusion pattern 23c is formed on the lower gate line 15B, a distance between the protrusion pattern 23c and the drain electrode 23b increases. This may eliminate the concern about the occurrence of the shortcircuit between the protrusion pattern 23c and the drain electrode 23b.

However, with the protrusion pattern 23c being formed on the lower gate line 15B, the column spacer 37 may cause a defect when it is located in correspondence with the lower gate line 15B. To avoid this, a black matrix 33b is designed to have a second area A2 larger by a width W1 than the first area A1.

Therefore, the black matrix 33b has to be formed wider than in FIG. 3. Accordingly, the black matrix 33b is disposed to overlap even a part of the open area of the pixel, thereby reducing the open area of the pixel by the overlapped part.

As mentioned above, according to the related art FFS type LCD device structure, as the protrusion pattern is formed on the lower gate line 15B to prevent the protrusion pattern and the drain electrode 23b from being shorted from each other, a defect may be caused due to the column spacer 37 when the column spacer 37 is located in correspondence with the lower gate line 15B. This may make the black matrix formed wider to overlap a part of the open area including a non-open area, reducing the open area of the pixel.

SUMMARY

A liquid crystal display device is provided, which includes: a first substrate and a second substrate bonded to each other with a spaced distance therebetween; a plurality of gate lines aligned on the first substrate in one direction in parallel to each other; a gate electrode extending from each of the gate lines; a gate insulating layer formed on a surface of the substrate including the gate electrode; a data line and a common line formed on the gate insulating layer to define pixel regions at intersecting points with the gate lines; a pixel electrode disposed on each pixel region defined at the intersecting point between each gate line and the data line and the common line; a transistor disposed at the intersecting point between each of the gate lines and the data line, the transistor having an active layer disposed on the gate electrode and the gate insulating layer, a source electrode, and a drain electrode spaced apart from the source electrode and having a horizontal portion and a bent portion; a protrusion pattern formed on the gate line, and corresponding to the bent portion of the drain electrode; a passivation layer formed on a surface of the first substrate having the protrusion pattern, and exposing the pixel electrode; a plurality of branched common electrodes formed on the passivation layer to be connected to the common line and overlap the pixel electrode; a pixel electrode connection pattern formed on the passivation layer to connect the pixel electrode to the drain electrode via the exposed passivation layer; a black matrix formed on the second substrate; a color filter layer located between the black matrixes; a column spacer formed on the second substrate corresponding to the protrusion pattern so as to be contactable with the protrusion pattern; and a liquid crystal layer interposed between the first substrate and the second substrate.

A method for fabricating a liquid crystal display device is provided. The method includes: preparing a first substrate and a second substrate; forming a plurality of gate lines aligned on the first substrate in one direction in parallel to each other, a gate electrode extending from each gate line, and a large pixel electrode; forming a gate insulating layer on a surface of the substrate having the gate electrode; forming a data line and a common line formed on the gate insulating layer to define pixel regions at intersecting points with the gate lines; forming a transistor at the intersecting point between the gate line and the data line, the thin film transistor comprising an active layer on the gate insulating layer, a source electrode, and a drain electrode spaced apart from the source electrode and having a horizontal portion and a bent portion, and forming a protrusion pattern on the gate line to correspond to the bent portion of the drain electrode; forming a passivation layer formed on a surface of the first substrate having the protrusion pattern to expose the pixel electrode; forming a plurality of branched common electrodes on the passivation layer, the branched common electrode being connected to the common line and overlapping the pixel electrode, and simultaneously forming a pixel electrode connection pattern on the passivation layer to connect the pixel electrode to the drain electrode; forming a black matrix on the second substrate to define a non-pixel area; forming a color filter layer on the second substrate corresponding to the pixel region between the black matrixes; forming a column spacer on the second substrate corresponding to the protrusion pattern to be contactable with the protrusion pattern; and forming a liquid crystal layer between the first substrate and the second substrate.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE EXEMPLARY EMBODIMENTS

A description will now be given in detail of an FFS type LCD device according to the exemplary embodiments, with reference to the accompanying drawings. For the sake of brief description with reference to the drawings, the same or equivalent components will be provided with the same reference numbers, and description thereof will not be repeated.

Figure 5:
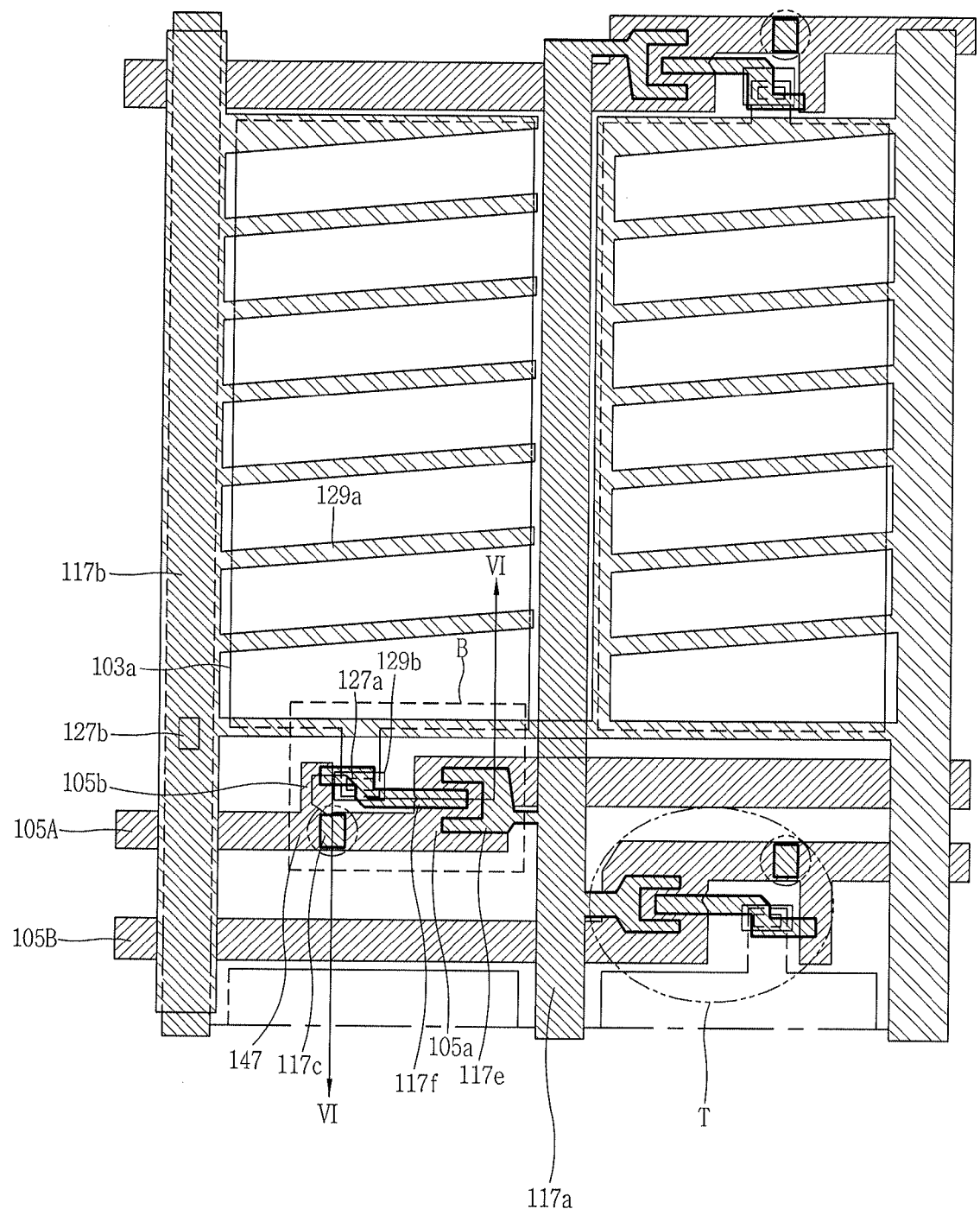
FIG. 5 is a planar view of an FFS type LCD device in accordance with the present disclosure.
Figure 6:
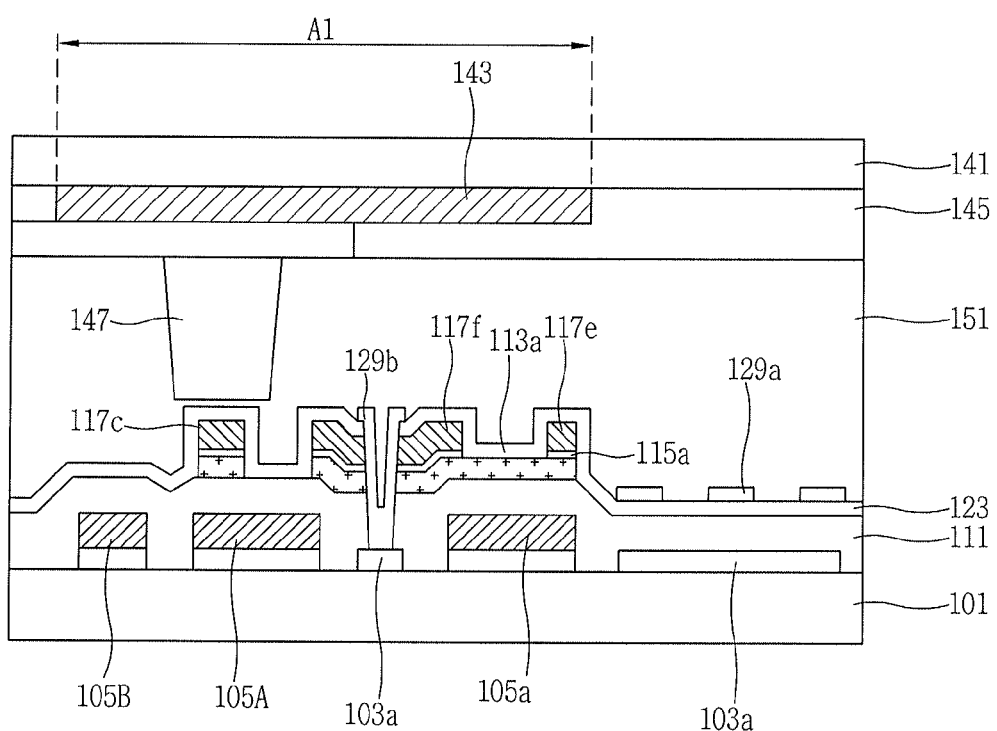
FIG. 6 is a sectional view taken along the line VI-VI of FIG. 5.
Figure 7:
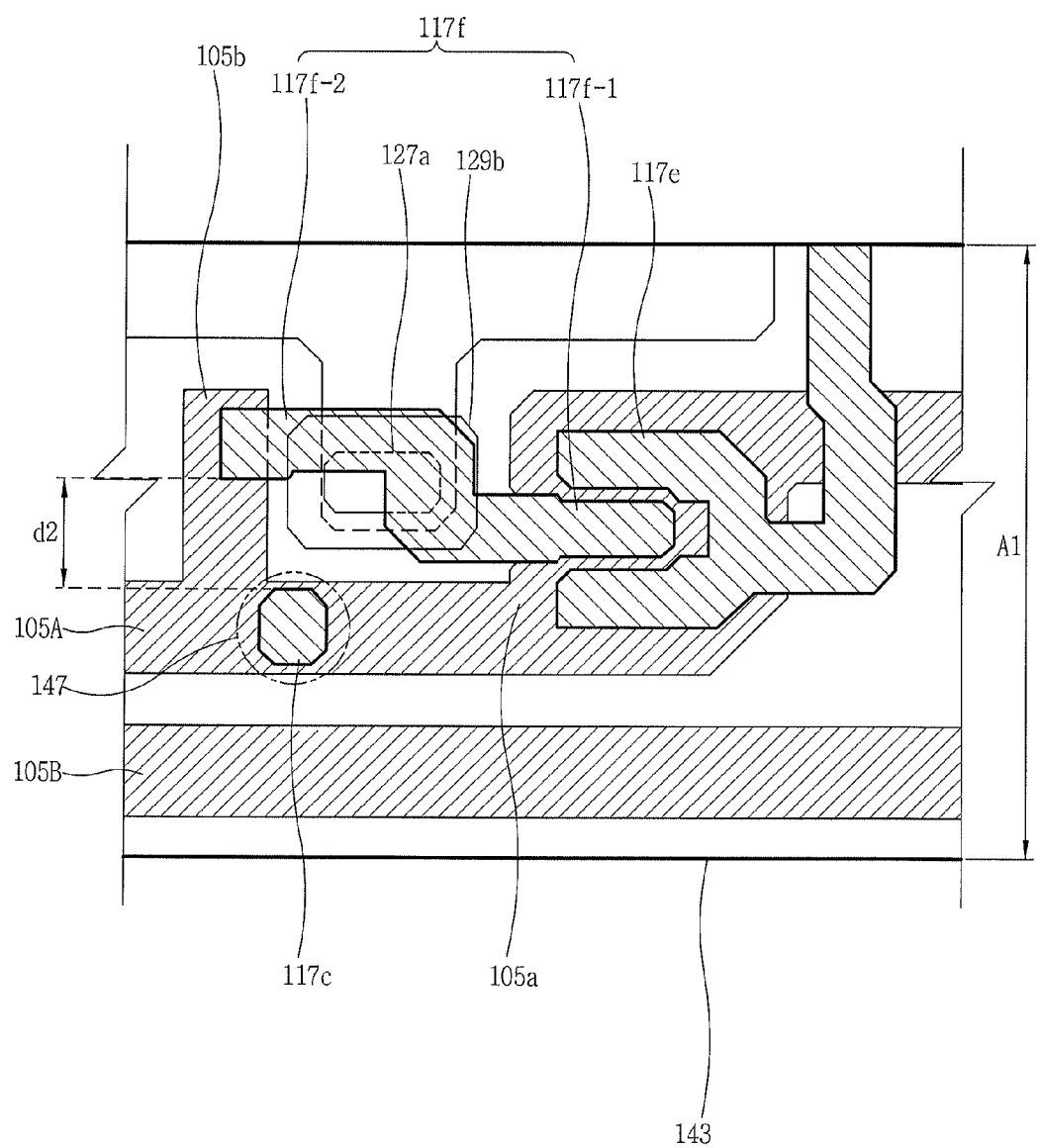
FIG. 7 is an enlarged planar view of a TFT unit, corresponding to a part "B" in FIG. 5, which schematically shows a protrusion pattern, which is formed on an upper gate line to be adjacent to a drain electrode, and a black matrix.

FIG. 5 is a planar view of an FFS type LCD device in accordance with the present disclosure, FIG. 6 is a sectional view taken along the line VI-VI of FIG. 5, and FIG. 7 is an enlarged planar view of a TFT unit, corresponding to a part "B" in FIG. 5, which schematically shows a protrusion pattern, which is formed on an upper gate line to be adjacent to a drain electrode, and a black matrix. Also, FIGS. 8A and 8Q are sectional views showing fabricating processes of an FFS type LCD device in accordance with the present disclosure.

Here, the LCD device according to the present disclosure may include several types of LCD devices, such as Fringe Field Switching (FFS) type, In-Plane Switching (IPS) type and Twisted Nematic (TN) type. Herein, the FFS type LCD device will be exemplarily described.

Referring to FIGS. 5 and 6, a first substrate 101 constructing the LCD device is shown having a plurality of gate lines 105A and 105B aligned in one direction in parallel to each other, and a gate electrode 105a extending from each of the gate lines 105A and 105B.

Figure 8A:
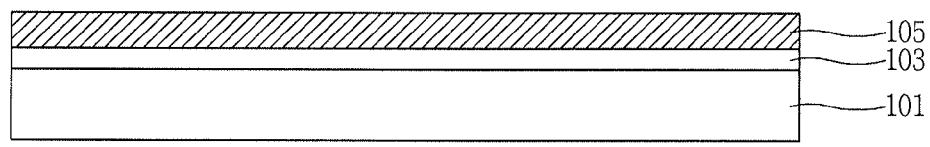
FIGS. 8A and 8Q are sectional views showing fabricating processes of an FFS type LCD device in accordance with the present disclosure.

Here, the gate lines 105a and 105B are implemented with a layered structure of a transparent conductive layer (now shown; see 103 of FIG. 8A) and a conductive metal layer (not shown; see 105 of FIG. 8A). Here, the transparent conductive layer 103 may be made of one selected from a transparent material group consisting of Indium Tin Oxide (ITO) and Indium Zinc Oxide (IZO). The present disclosure exemplarily describes a case that the transparent conductive layer 103 is formed of the ITO.

Also, the conductive metal layer 105 may be made of at least one selected from a conductive metal group consisting of Aluminum (Al), Tungsten (W), Copper (Cu), Molybdenum (Mo), Chrome (Cr), Titanium (Ti), Molytungsten (MoW), Molytitanium (MoTi) and Copper/Molytitanium (Cu/MoTi). The present disclosure exemplarily describes a case that the conductive metal layer 105 is formed of Copper (Cu).

The pixel electrode 103a may be formed on an entire pixel region of the first substrate 101 corresponding to a space spaced from the gate lines 105A and 105B and a data line 117a. Here, the pixel electrode 103a may be formed of one selected from a transparent material group consisting of ITO and IZO. The present disclosure exemplarily describes a case that the transparent conductive layer 103 is formed of the ITO.

Each of the gate lines 105A and 105B is shown having a perpendicular pattern 105b which overlaps a drain electrode 117f to form a parasitic capacitor (Cgs). Here, when an overlay shift between the gate lines 105A and 105B and the data line 117a is generated due to process variation, a difference of a parasitic capacitor (Cgs) value is generated between left and right pixels. Thus, to compensate for the parasitic capacitor (Cgs) values with the difference from each other, the perpendicular pattern 105b is formed on each of the gate lines 105A and 105B.

With the perpendicular pattern 105b being formed on each of the gate lines 105A and 105B, when the drain electrode 117f is shifted due to process variation and accordingly the overlapped portion between the drain electrode 117f and the gate electrode 105a and the perpendicular pattern 105b changes, the parasitic capacitor value at the overlapped portion may be appropriately compensated for. That is, when an overlapped area between the drain electrode 117f located on a left pixel and the gate line 105A is larger than an overlapped area between the drain electrode 117f and the gate electrode 105a, an overlapped area between the drain electrode 117f located on a right pixel and the gate line 105A becomes smaller than an overlapped area between the drain electrode 117f and the gate electrode 105a, maintaining the same parasitic capacitor (Cgs) value between the left and right pixels.

Also, the present disclosure has explained the DRD structure employing the FFS mode as a structure for preventing reduction of transmittance. In this structure, a common line formed in a horizontal direction is removed and a common line 117b is formed perpendicular to the gate line by using the metal layer used as the data line.

The FFS type LCD device is allowed to separate a common line from a storage capacitor (Cgs) forming region, unlike the IPS type or TN type. Accordingly, the common line 117b may be formed perpendicular to the gate line by using the metal layer for forming a source electrode and a drain electrode.

A gate insulating layer 111 may be formed on an entire surface of the first substrate 101 having the gate electrode 105a. On the gate insulating layer 111 may be formed a data line 117a and a common line 117b to define pixel regions at perpendicularly intersecting points with the gate lines 105A and 105B.

A large pixel electrode 103a may be formed at the pixel region defined at the intersecting point between the gate lines 105A and 105B and the data line 117a and the common line 117b. Here, the pixel electrode 103a may be implemented using one of transparent conductive materials, such as ITO and IZO.

In addition, referring to FIG. 7, at the intersecting point between the gate lines 105A and 105B and the data line 117a may be disposed a Thin Film Transistor (T), which is formed on the gate insulating layer 111 on the gate electrode 105a and includes an active layer 113a, an Ohmic contact layer 115a, a source electrode 117e, and a drain electrode 117f spaced apart from the source electrode 117e and divided into a horizontal portion 117f-1 and a bent portion 117f-2.

A protrusion pattern 117c corresponding to the bent portion 117f-2 of the drain electrode 117f may be formed on the gate insulating layer 111 located on the gate line 105A. Here, the protrusion pattern 117c may be located on the gate line 105A to overcome touch and gravity influences generated by a contact area between the TFT and a column spacer 37 formed on the second substrate 41. Especially, the protrusion pattern 117c may be located on the gate line 105A, different from the related art having the protrusion pattern 117c formed on the gate line 105B which is located below the gate line 105A.

Figure 1:
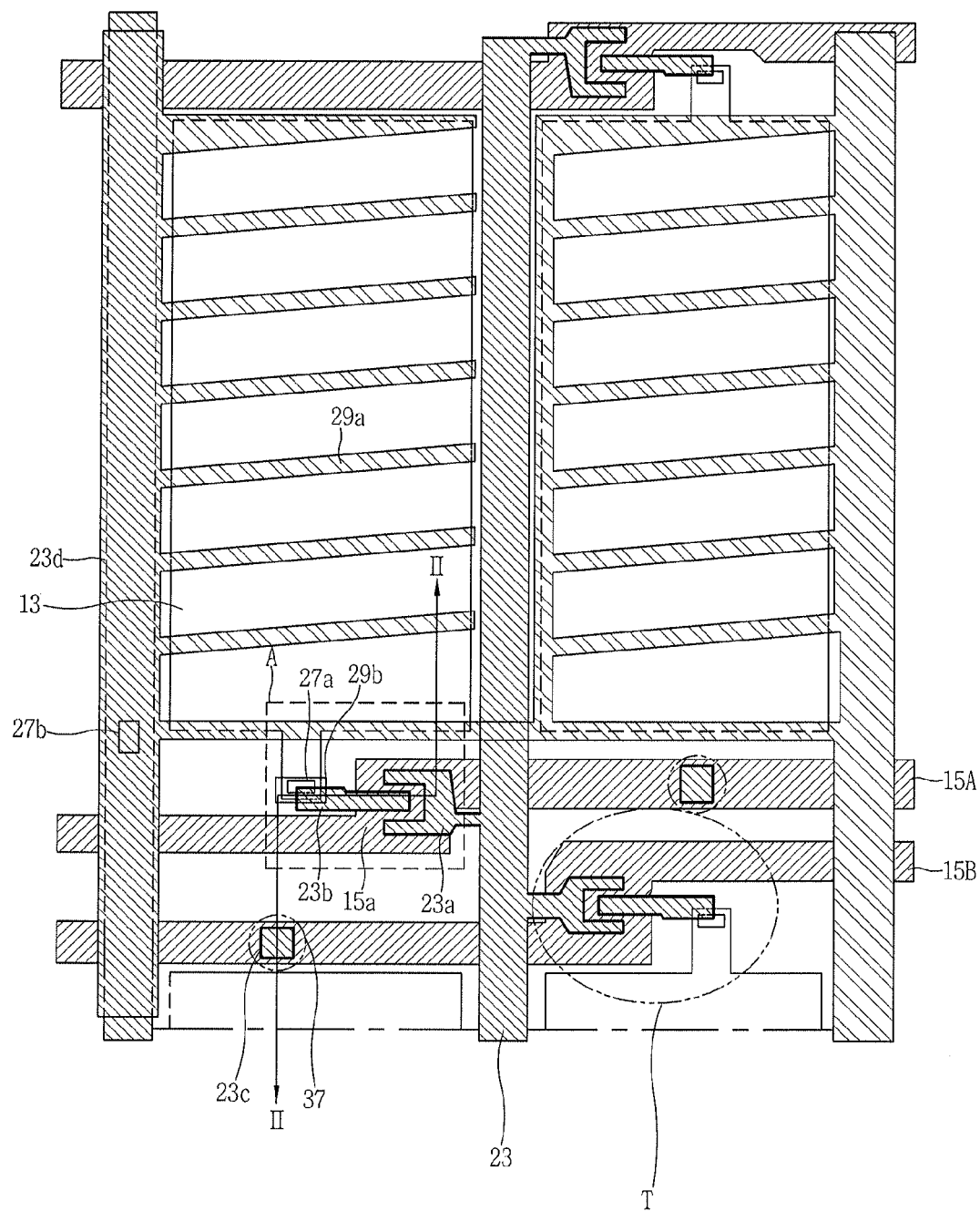
FIG. 1 is a planar view of an FFS type LCD device according to the related art.
Figure 2:
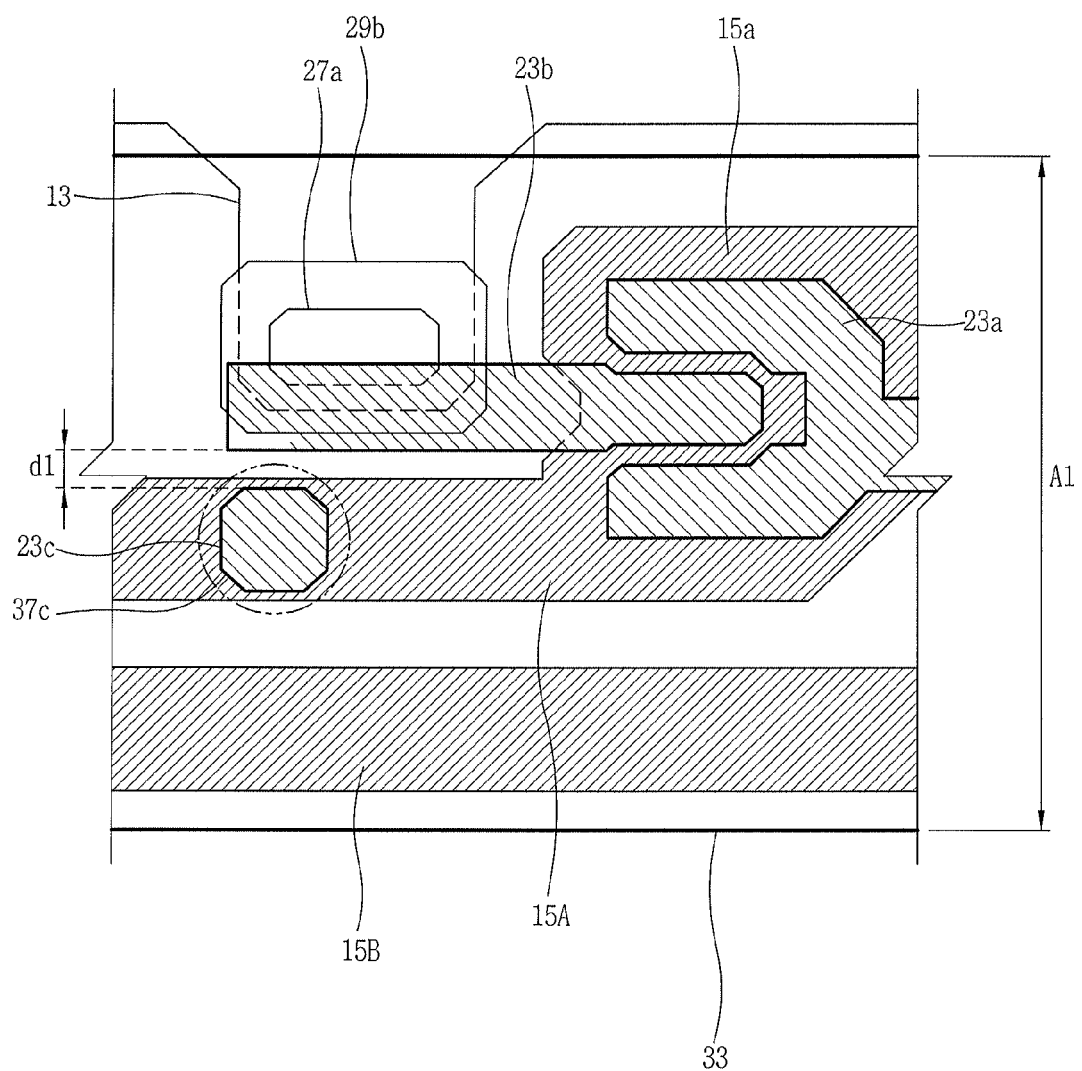
FIG. 2 is a sectional view taken along the line II-II of FIG. 1.
Figure 3:
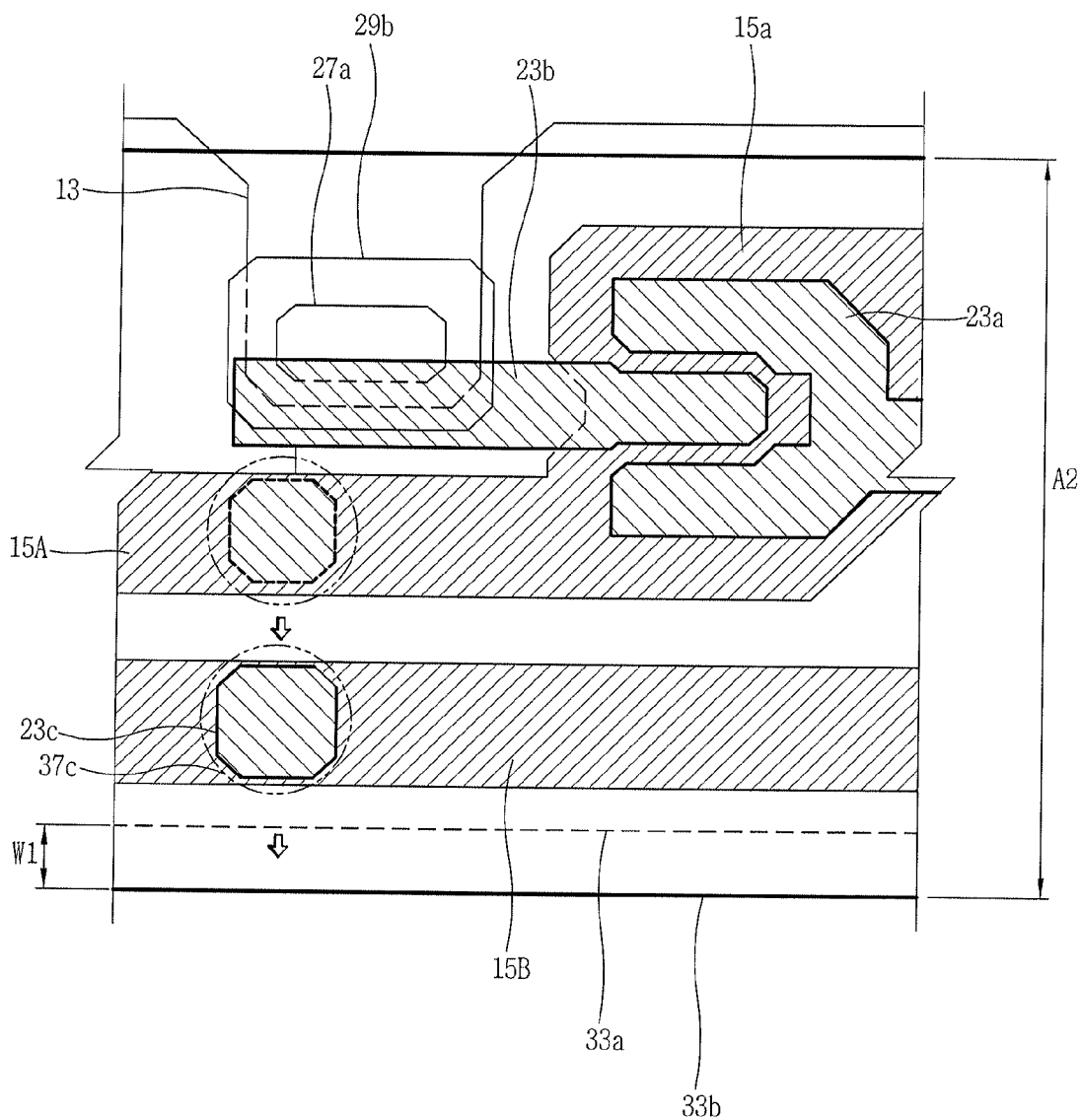
FIG. 3 is an enlarged planar view of a TFT unit, corresponding to a part "A" in FIG. 1, which schematically shows the protrusion pattern, which is formed on the gate line to be adjacent to the straight drain electrode, and the black matrix.

Accordingly, even if the protrusion pattern 117c is located above the gate line 105A, a distance d2 between the protrusion pattern 117c and the bent portion 117f-2 of the drain electrode 117f is longer than the distance d1 of FIG. 2. This may result in overcoming the problem that the protrusion pattern 117c and the drain electrode 117f are likely to be shorted from each other. As one side of the drain electrode 117f is formed in the form of the bent portion 117f-2 to be spaced apart from the protrusion pattern 117c by a preset distance, the protrusion pattern 117c and the drain electrode 117f may be unlikely to be shorted from each other. That is, a distance between the bent portion 117f-2 of the drain electrode 117f and the protrusion pattern 117c may be longer than a distance between the horizontal portion 117f-1 of the drain electrode 117f and the protrusion pattern 117c.

Here, the shape of the bent portion 117f-2 of the drain electrode 117f may change in different shapes in some cases. Any shape may be available if it can maintain a distance long enough to prevent the shorting from the protrusion pattern 117c, but it should be met that a part of the bent portion 117f-2 of the drain electrode overlaps the perpendicular pattern 105b.

A passivation layer 123, which has a first contact hole 123a and a second contact hole 123b for exposing the pixel electrode 103a and the common line 117b, respectively, may be formed on an entire surface of the first substrate including the protrusion pattern 117c.

In addition, on the passivation layer 123 may be formed a plurality of branched common electrodes 129a which are connected to the common line 117b via the second contact hole 127b and overlap the pixel electrode 103a, and a pixel electrode connection pattern 129b for connecting the pixel electrode 103a to the drain electrode 117f via the first contact hole 123a.

Also, the branched common electrodes 129a may overlap the pixel electrode 103a and be electrically connected to the common line 117b.

Here, the branched common electrode 129a may be formed of one selected from a transparent material group consisting of ITO and IZO. The present disclosure exemplarily describes a case that the common electrode 129a is formed of the ITO.

The pixel electrode connection pattern 129b may electrically connect the pixel electrode 110 to the drain electrode 117d via the first contact hole 127a.

Referring to FIGS. 6 and 7, a black matrix 143 which defines a non-pixel region may be formed on the second substrate 141. A color filter layer 145 which defines a pixel region between the black matrixes 143 may be formed on the second substrate 141.

Figure 4:
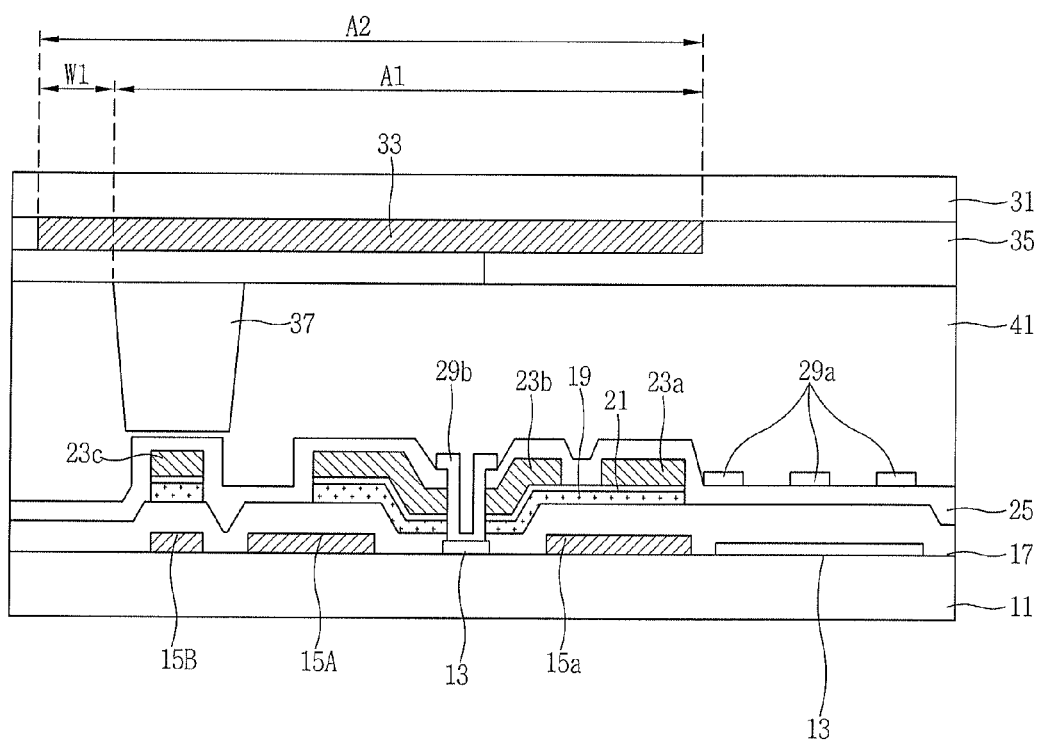
FIG. 4 is an enlarged planar view of the TFT unit, corresponding to the part "A" in FIG. 1, which schematically shows the protrusion pattern formed on the lower gate line and the black matrix.

The black matrix 143 may have an area defined by the upper gate line 105A, the lower gate line 105B and the TFT (T) as the non-pixel region, namely, be present with a width corresponding to an area A1. Here, the area A1 of the black matrix 143 may be smaller than the area A2 of the related art black matrix 33b shown in FIG. 4. Since the protrusion pattern 117c is formed to be located on the upper gate line 105A, it may be possible that the black matrix 143 overlaps up to the upper surface of the lower gate line 105B. This may allow for reduction of the area covered by the black matrix 143.

Therefore, unlike the related art in which the protrusion pattern is formed on the lower gate line to be prevented from being shorted from the drain electrode and accordingly the black matrix occupies up to an open area as well as the lower gate line, the formation of the protrusion pattern on the upper gate line according to the present invention may prevent the black matrix from overlapping the open area, resulting in preventing reduction of the open area.

The second substrate 141 corresponding to the protrusion pattern 117c may include a column spacer 147 which is contactable with the protrusion pattern 117c.

A liquid crystal layer 151 may be interposed between the first substrate 101 and the second substrate 141.

With the configuration, when a data signal is sent to the pixel electrode 103a via the TFT (T), a fringe field is formed between the common electrode 129a provided with a common voltage and the pixel electrode 103a. This allows liquid crystal molecules arranged in a horizontal direction between the first and second substrates 101 and 141 to be rotated by dielectric anisotropy. Light transmittance transmitted through the pixel region may change depending on the rotation rate of the liquid crystal molecules, implementing gradation.

The present disclosure exemplarily illustrates, but not limited to, the DRD structure. The present disclosure may also be applicable to any of Z-inversion type LCD device structures.

Also, the present disclosure exemplarily illustrates, but not limited to, the LCD device in which left and right data lines based on a vertical data line are omitted and common lines Vcom are formed on the corresponding positions. The LCD device according to the present disclosure may be applied to a case where the common line and the gate line are formed in parallel to each other.

In addition, the present disclosure may be applicable to an LCD device having a structure in which TFTs are formed from data lines on left and right pixels based on a data line.

The present disclosure may also be applied to an LCD device having a structure of compensating for a difference between parasitic capacitor (Cgs) values generated from left and right pixels due to a process variation, namely, an LCD device having a perpendicular pattern formed.

Hereinafter, description will be given of a method for fabricating an LCD device in accordance with the present disclosure having the configuration, with reference to FIGS. 8A to 8Q.

FIGS. 8A and 8Q are sectional views showing fabricating processes of an LCD device according to the present disclosure.

As shown in FIG. 8A, a plurality of pixel regions including switching regions are defined on the transparent first substrate 101. A first transparent conductive layer 103 and a first conductive metal layer 105 are sequentially deposited on the first substrate 101 by sputtering. Here, the first transparent conductive layer 103 may be made of one selected from a group consisting of ITO and IZO. Herein, a case where the first transparent conductive layer 103 is made of the ITO will be exemplarily described.

Also, the first conductive metal layer 105 may be made of at least one selected from a conductive metal group consisting of Aluminum (Al), Tungsten (W), Copper (Cu), Molybdenum (Mo), Chrome (Cr), Titanium (Ti), Molytungsten (MoW), Molytitanium (MoTi) and Copper/Molytitanium (Cu/MoTi). Herein, a case where the first conductive layer 105 is made of the Copper (Cu) will be exemplarily described.

Figure 8B:
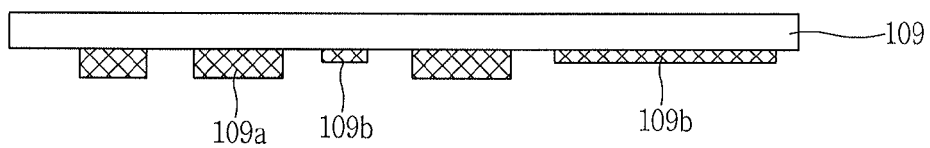
Figure 8B:
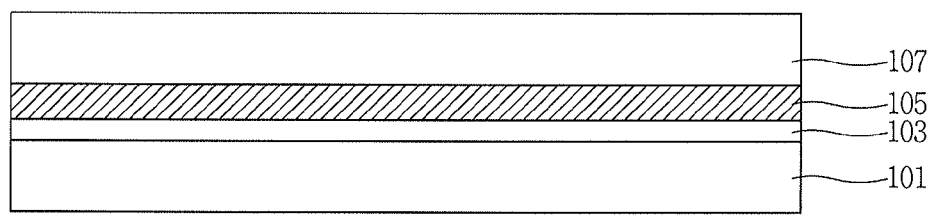

Referring to FIG. 8B, a photo-resist having a high transmittance is coated on the first conductive metal layer 105, forming a first photosensitive film 107.

Afterwards, an expose process is performed for the first photosensitive layer 107 through a first mask process using a first half-ton mask 109 having a light blocking pattern 109a and a semi-transparent pattern 109b.

The light blocking pattern 109a of the first half-ton mask 109 may be located on the first photosensitive layer 107, which corresponds to regions where the gate line and the gate electrode are to be formed. The semi-transparent pattern 109b may be located on the first photosensitive film 107 corresponding to a region where the pixel electrode is to be formed.

Figure 8C:
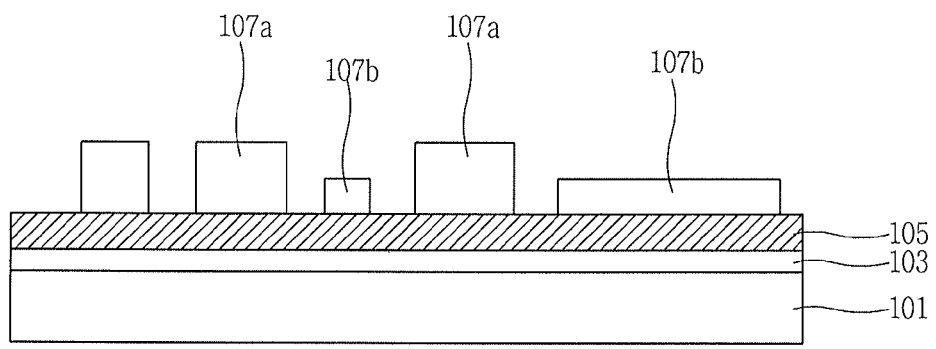

Referring to FIG. 8C, after completion of the exposure process, a develop process is performed to selectively remove the first photosensitive film 107, forming first pattern portions 107a corresponding to the gate line and gate electrode forming regions, and a second pattern portion 107b corresponding to the pixel electrode forming region.

Here, the first pattern portion 107a may be opaque, so it maintains the thickness of the first photosensitive film 107. However, the second pattern portion 107b is allowed to transmit some light therethrough and accordingly removed by a preset thickness. That is, the first pattern portion 107b may be thinner than the second pattern portion 107a.

Figure 8D:
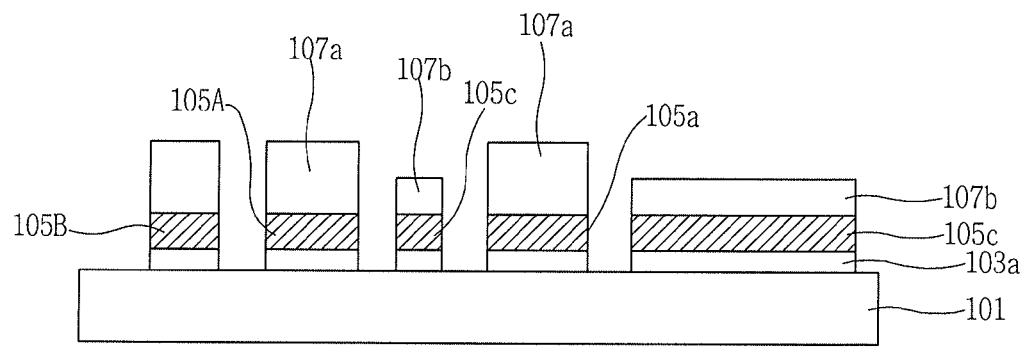

Referring to FIG. 8D, the first transparent conductive layer 103 and the first conductive metal layer 105 are selectively etched by using the first pattern portions 107a and the second pattern portion 107b of the first photosensitive film 107 as etching masks, defining gate lines 105A and 105B, a gate electrode 105a and a pixel electrode 103a.

Figure 8E:
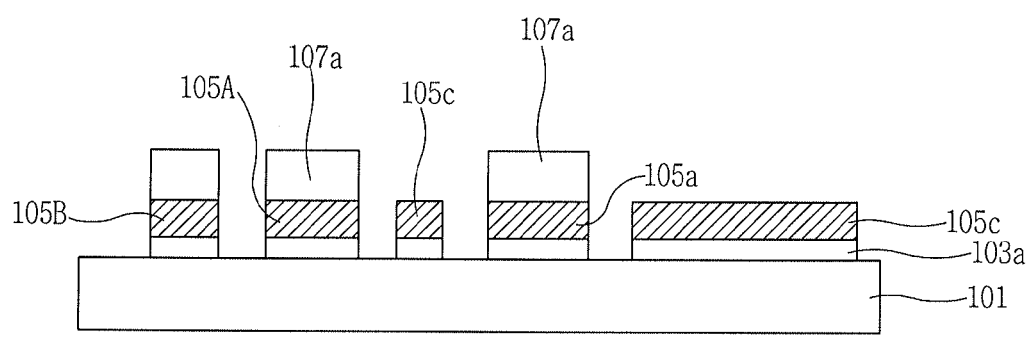

Referring to FIG. 8E, an ashing process is performed to etch out part of the first pattern portion 107a of the first photosensitive film 107 located on the gate lines 105A and 105B and the gate electrode 105a, and completely etch out the second pattern portions 107b of the first photosensitive film located on the pixel electrode 103a, thereby exposing an upper surface of the conductive layer 105c located on the pixel electrode 103a.

Figure 8F:
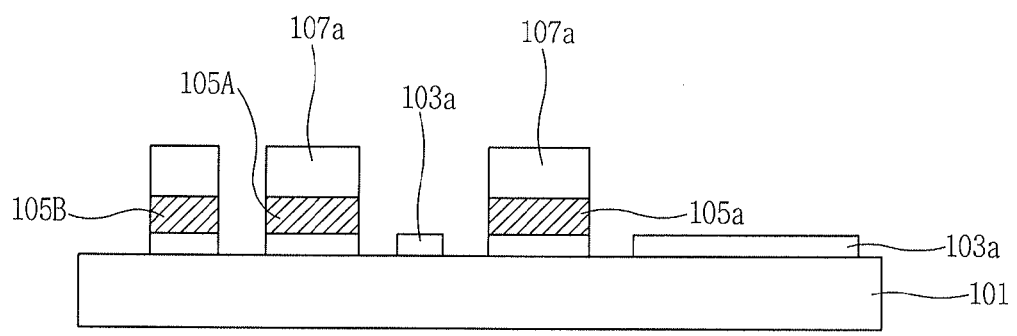

Referring to FIG. 8F, the exposed conductive layer 107b is etched by using the first pattern portion 107a, which has been partially etched in thickness through the ashing process, as an etching mask, thereby forming the pixel electrode 103a. Here, the pixel electrode 103a is externally exposed by completely etching the exposed first conductive metal layer 107b.

Figure 8G:
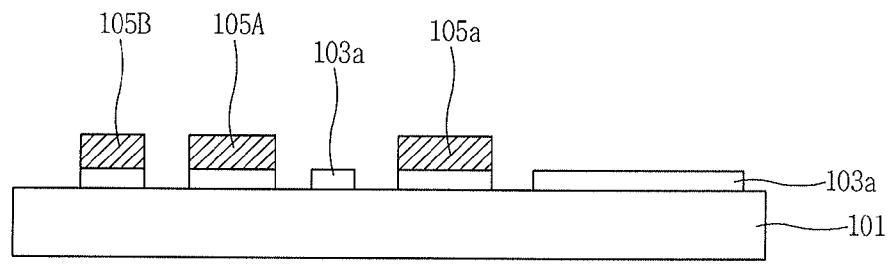

Referring to FIG. 8G, the first pattern portion 107a is etched to externally expose the gate lines 105A and 105B and the gate electrode 105a. Here, the gate lines 105A and 105B and the gate electrode 105a may be implemented in a layered structure of the first transparent conductive layer and the first conductive metal layer.

Figure 8H:
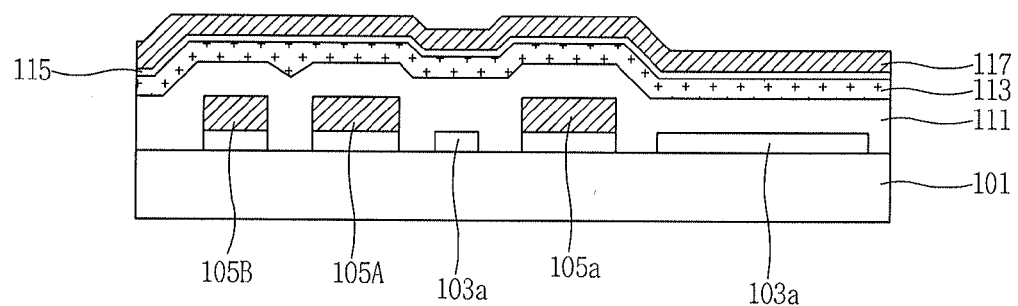

Referring to FIG. 8H, a gate insulating layer 111 formed of silicon nitride (SiNx) or silicon oxide (SiO$_2$) is formed on an entire surface of the first substrate including the pixel electrode 103a. An amorphous silicon film (a-Si:H) 113, an amorphous silicon film 115 (n+ or p+) containing impurities, and a second conductive metal layer 117 are deposited on the gate insulating layer 111 in a sequential manner.

Here, the amorphous silicon film (a-Si:H) 113 and the amorphous silicon film 115 (n+ or p+) containing impurities may be deposited through a Chemical Vapor Deposition (CVD), and the second conductive metal layer 117 is deposited through sputtering.

Here, the CVD and the sputtering are merely described as the deposition methods, but if necessary, other deposition methods may also be employed.

Also, the second conductive metal layer 117 may be made of at least one selected from a conductive metal group consisting of Aluminum (Al), Tungsten (W), Copper (Cu), Molybdenum (Mo), Chrome (Cr), Titanium (Ti), Molytungsten (MoW), Molytitanium (MoTi) and Copper/Molytitanium (Cu/MoTi).

Figure 8I:
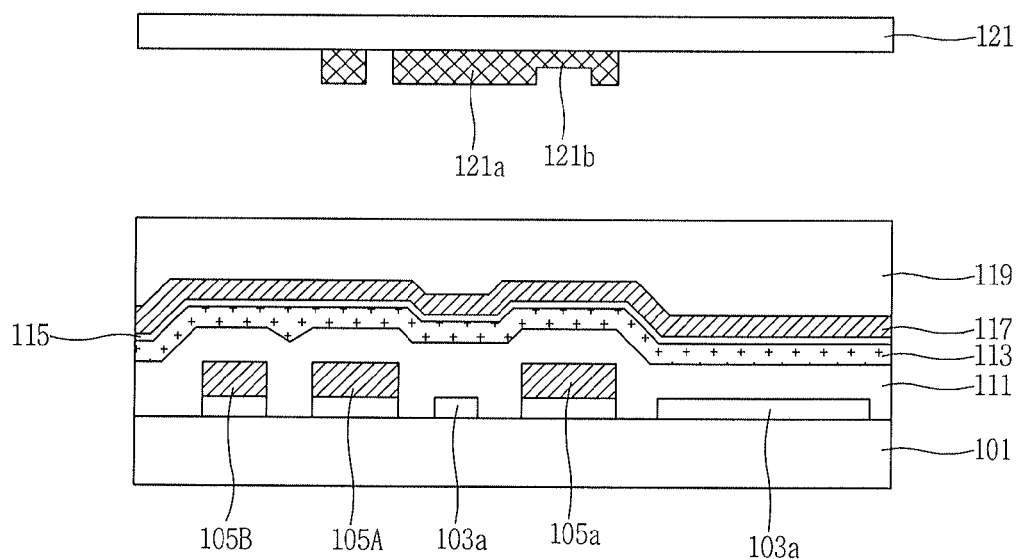

Referring to FIG. 8I, a photo-resist having a high light transmittance is deposited on the second conductive metal layer 117, forming a second photosensitive layer 119.

Next, an expose process is performed for the second photosensitive layer 119 through a second mask process using a second half-ton mask having a light blocking pattern 121a and a semi-transparent pattern 121b.

The light blocking pattern 119a of the second half-ton mask 121 is located on the second photosensitive film 119 corresponding to regions where the data line, the source electrode, the drain electrode, the common line and the protrusion pattern are to be formed, respectively. The semi-transparent pattern 121b of the second half-ton mask 121 may be located on the second photosensitive film 119 corresponding to a channel forming region of the TFT (T).

Figure 8J:
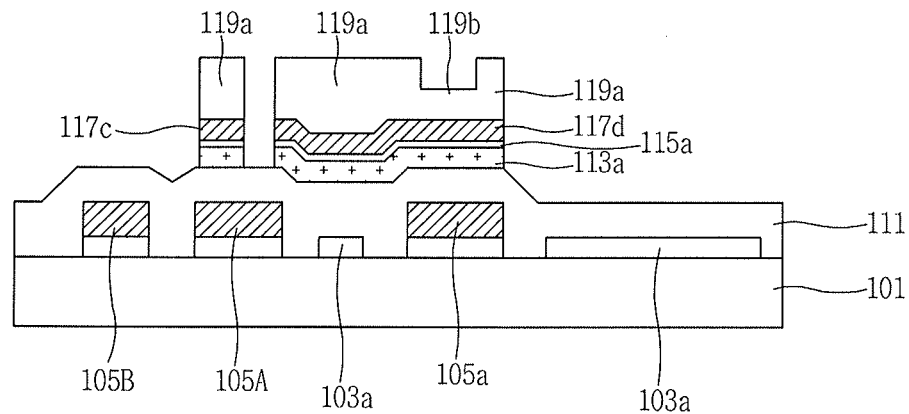

Referring to FIG. 8J, after completion of the expose process, a develop process is performed to etch the second photosensitive film 119, forming a first pattern portion 119a corresponding to regions where the data line, the source electrode, the drain electrode, the common line and the protrusion pattern are to be formed, and a second pattern portion 119b corresponding to a channel forming region.

Here, the first pattern portion 119a is opaque, so it maintains the thickness of the second photosensitive film 119. However, the second pattern portion 119b is allowed to transmit some light therethrough and accordingly removed by a preset thickness. That is, the second pattern portion 119b may be thinner than the first pattern portion 119a.

Next, the second conductive metal layer 117, the amorphous silicon film 115 containing impurities, and the amorphous silicon film 113 are sequentially etched by using the first pattern portion 119a and the second pattern portion 119b of the second photosensitive layer 119 as etching masks, thereby forming an active layer 113a and an Ohmic contact layer 115a on the gate insulating layer 111 corresponding to the gate electrode 105a, as well as a data line 117a and a common line (not shown; see 117b of FIG. 5), which perpendicularly intersect with the gate lines 105A and 105B, a protrusion pattern 117c, and a second conductive metal layer pattern 117d. Here, the protrusion pattern 117c is located above the gate line 105A.

Figure 8K:
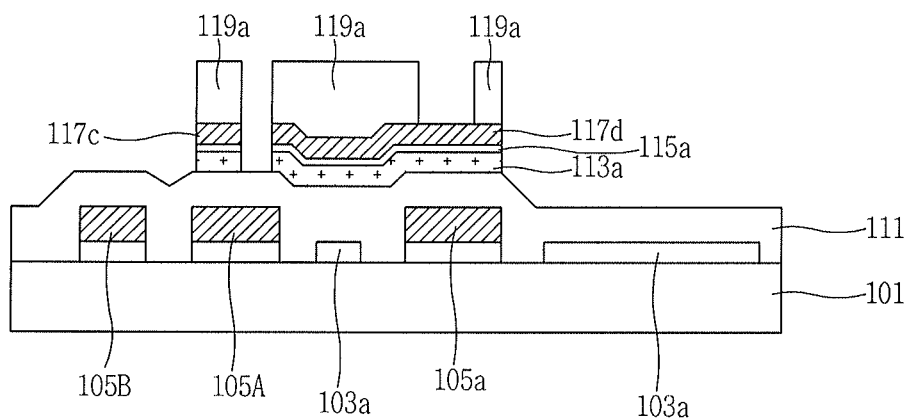

Referring to FIG. 8K, an ashing process is performed to partially remove the first pattern portions 119 corresponding to the source and drain electrode forming regions, the common line forming region and the protrusion pattern forming region, and completely remove the second pattern 119b corresponding to the channel forming region. Here, an upper surface of the second conductive metal layer pattern 117d which overlaps the channel forming region is exposed to the outside.

Figure 8L:
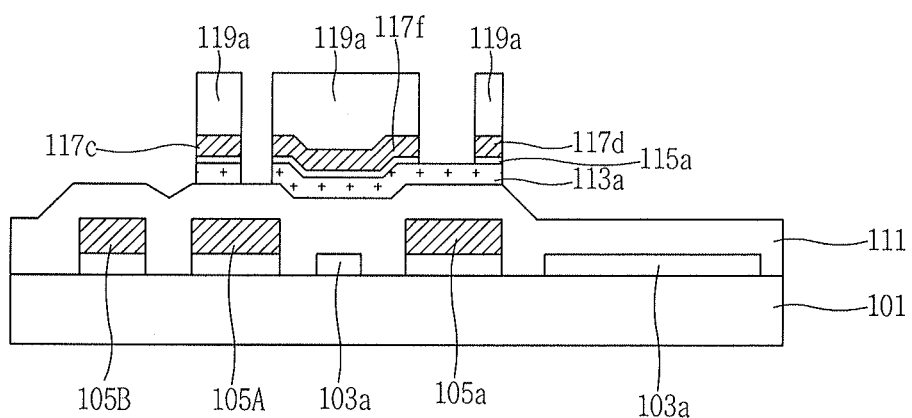

Referring to FIG. 8L, the exposed portion of the second conductive metal layer pattern 117d is etched by using the partially removed first pattern portion 119a as an etching mask, thereby forming a source electrode 117e and a drain electrode 117f spaced apart from each other. Here, the drain electrode 117f may include a horizontal portion 117f-1 and a bent portion 117f-2.

Also, the bent portion 117f-2 of the drain electrode 117f may correspond to the protrusion pattern 117c disposed above the gate line 105A. Here, the protrusion pattern 117c may be formed to be located above the gate line 105A to overcome touch and gravity influences generated due to a contact area between the TFT and a column spacer 147 formed on the second substrate 141. Especially, the protrusion pattern 117c may be located on the gate line 105A, different from the related art having the protrusion pattern 117c formed on the gate line 105B which is located below the gate line 105A.

Therefore, even if the protrusion pattern 117c is located above the gate line 105A, a distance d2 between the protrusion pattern 117c and the bent portion 117f-2 of the drain electrode 117f is longer than a distance d1 shown in the related art of FIG. 2. Accordingly, the protrusion pattern 117c and the drain electrode 117f may be unlikely to be shorted from each other. Here, the shape of the bent portion 117f-2 of the drain electrode 117f may change in different shapes in some cases. Any shape may be available if it can maintain a distance long enough to prevent the shortcircuit from the protrusion pattern 117c, but it should be met that a part of the bent portion 117f-2 of the drain electrode overlaps the perpendicular pattern 105b to compensate for a parasitic capacitor (Cgs).

Afterwards, the Ohmic contact layer 115a exposed between the source electrode 117e and the drain electrode 117f is also etched to have a spaced distance. Here, a channel region is formed on the active layer 113a located under the etched Ohmic contact layer 115a.

Figure 8M:
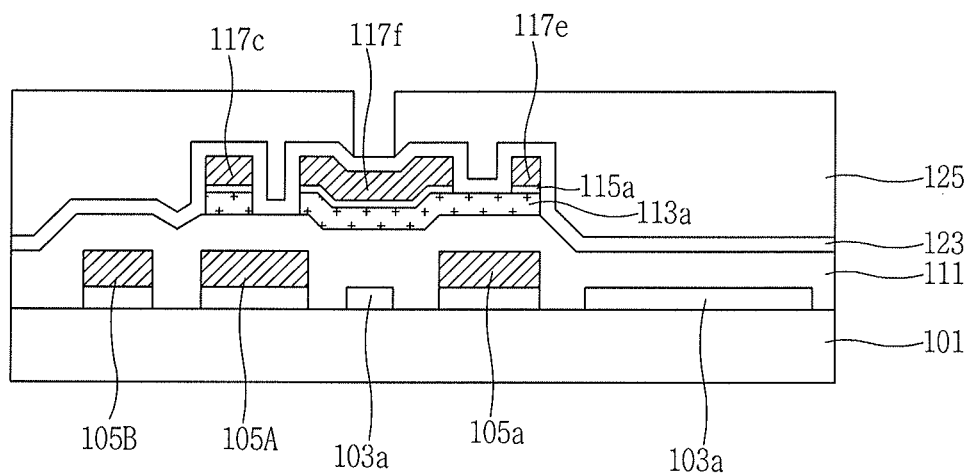

Referring to FIG. 8M, after removing the first pattern portion 119a of the second photosensitive layer 119, an inorganic insulating material or an organic insulating material formed of silicon nitride (Sinx) or silicon oxide (SiO$_2$) is deposited on the entire surface of the first substrate 101, forming a passivation layer 123. A photo-resist having a high transmittance is then deposited on the passivation layer 123, forming a third photosensitive layer (not shown). Herein, the passivation layer 123 formed of the inorganic insulating material consisting of SiNx or SiO$_2$ is exemplarily illustrated.

Then, the expose and develop processes are performed through a third mask process using an exposure mask (not shown), to pattern the third photosensitive layer, forming a third photosensitive layer pattern 125.

Figure 8N:
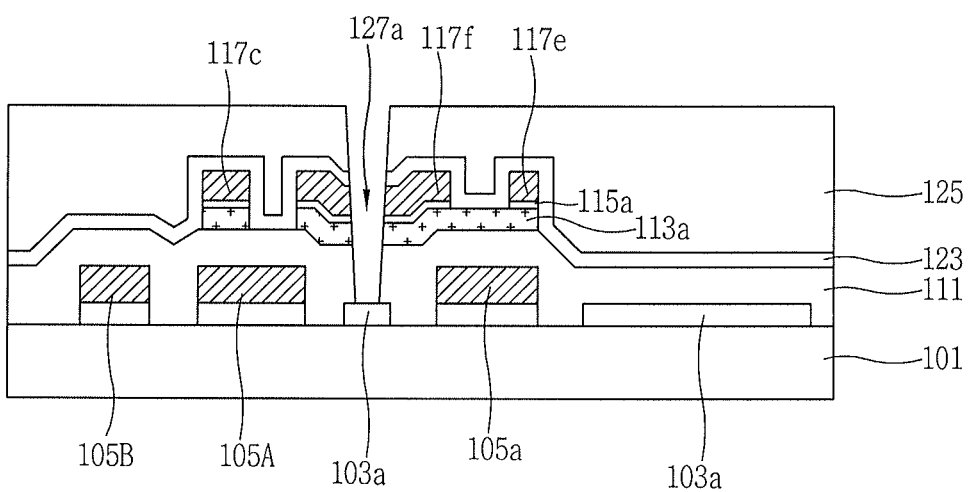

Referring to FIG. 8N, the passivation layer 123 and the lower gate insulating layer 111 are selectively etched using the third photosensitive pattern 125 as a mask, thereby forming a first contact hole 127a for exposing the drain electrode 117f and the pixel electrode 103a, and a second contact hole 127b for exposing the common line 117b.

Figure 8O:
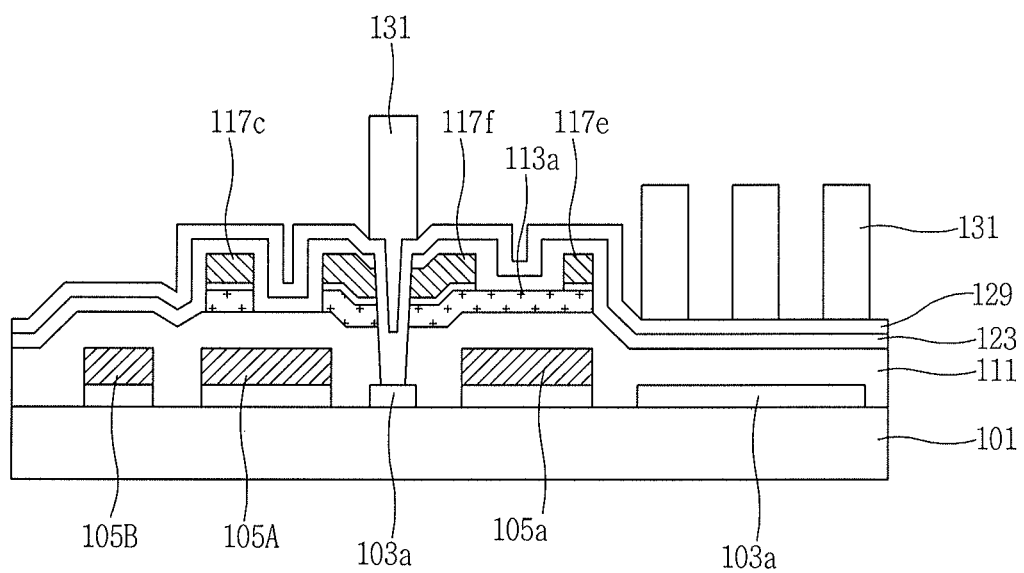
Figure 8P:
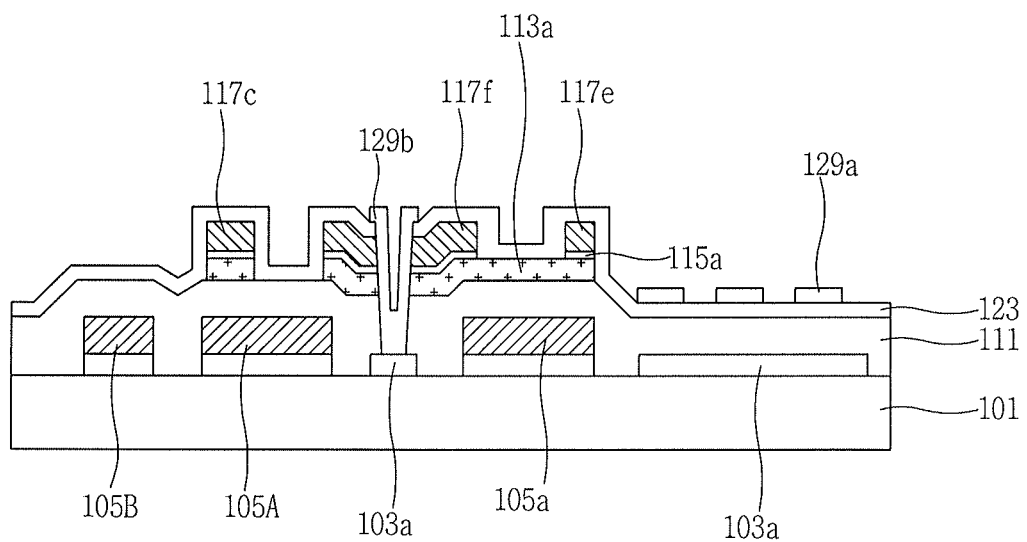
Figure 8Q:
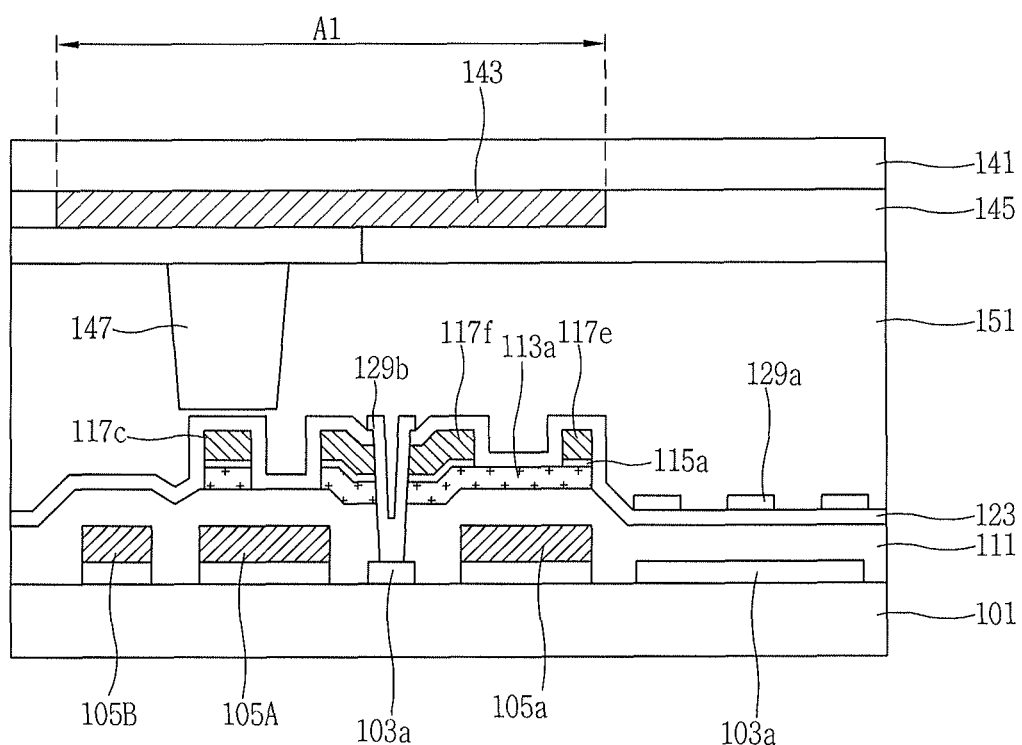

Referring to FIG. 8O, the third photosensitive layer 125 is removed, and a second transparent conductive layer 129 is deposited on the passivation layer 123 including the first and second contact holes 127a and 127b through magnetron sputtering. Here, the second transparent conductive layer 129 may be formed of one selected from a transparent material group consisting of ITO and IZO.

A photo-resist having a high transmittance is then coated on the second transparent conductive layer 129, thereby forming a fourth photosensitive layer (not shown).

Afterwards, the expose and develop processes are performed through a fourth mask process using an exposure mask (not shown), to selectively pattern the fourth photosensitive layer, forming a fourth photosensitive layer pattern 131.

Referring to FIG. 8Q, the second transparent conductive layer 129 is selectively etched by using the fourth photosensitive layer pattern 131 as an etching mask, thereby simultaneously forming a plurality of branched common electrodes 129a spaced apart from each other, and a pixel electrode connection pattern 129b for electrically connecting the pixel electrode 103a to the drain electrode 117f via the first contact hole 127a. Here, the plurality of branched common electrode 129a, although not shown, may be electrically connected to the common line 117b via the second contact hole 127b.

Although not shown, the fourth photosensitive layer pattern 131 is removed, to form a lower alignment layer (not shown) on an entire surface of the substrate including the plurality of common electrodes 129a, thereby completing a fabricating process of an array substrate for the FFS type LCD device according to the present disclosure.

Still referring to FIG. 8Q, a black matrix 143 for preventing light from being transmitted to regions except for pixel regions is formed on a color filter substrate, namely, the second substrate 141, which is bonded to the TFT substrate, namely, the first substrate 101 with a spaced distance therebetween.

Afterwards, red, green and blue color filter layers 145 are formed on the pixel regions of the color filter substrate 141. Here, the black matrixes 143 are located among the red, green and blue color filter layers 145 on the second substrate 141.

Here, the black matrix 143 may overlap regions except for the pixel regions of the first substrate 101, for example, the TFT (T), the gate lines 105A and 105B and the data line 117a, upon bonding the second substrate 141 to the first substrate 101.

Upon the bonding of the second substrate 141 to the first substrate 101, a column spacer 147 for maintaining a preset gap is formed on the second substrate 141. Here, the column spacer 147 is formed on the second substrate 151 corresponding to the protrusion pattern 117c formed on the first substrate 101, so as to overcome touch and gravity influences generated due to a contact area with the TFT (T).

Although not shown, a liquid crystal layer 151 is formed between the first substrate 101 and the second substrate 141, thereby completely fabricating the FFS type LCD device according to the present disclosure.

As described above, according to an LCD device and a fabricating method thereof of the present disclosure, a structure of a drain electrode may change to increase a distance between the drain electrode and a protrusion pattern, thereby preventing a short-circuit between the protrusion pattern and the drain electrode.

Also, even if the drain electrode structure is shifted, the shifted portion corresponds to a non-open region obscured by a black matrix. Hence, the protrusion pattern for maintaining a gap of a column spacer may be formed without a reduction of an open area and a perpendicular pattern may be formed on a gate line, resulting in preventing a defect due to variation of a parasitic capacitor (Cgs).

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A liquid crystal display device comprising:
a first substrate and a second substrate bonded to each other with a spaced distance therebetween;
a plurality of gate lines aligned on the first substrate in one direction in parallel to each other;
a gate electrode extending from each of the gate lines;
a gate insulating layer formed on a surface of the substrate including the gate electrode;
a data line and a common line formed on the gate insulating layer to define pixel regions at intersecting points with the gate lines;
a pixel electrode disposed on each pixel region defined at the intersecting point between each gate line and the data line and the common line;
a transistor disposed at the intersecting point between each of the gate lines and the data line, the transistor having an active layer disposed on the gate electrode and the gate insulating layer, a source electrode, and a drain electrode spaced apart from the source electrode and having a first horizontal portion, a second horizontal portion, and a bent portion between the first and second horizontal portions;
a protrusion pattern formed on the gate line, and facing the second horizontal portion of the drain electrode in a direction parallel to the data line;
a passivation layer formed on a surface of the first substrate having the protrusion pattern, and exposing the pixel electrode;
a plurality of branched common electrodes formed on the passivation layer to be connected to the common line and overlap the pixel electrode;
a pixel electrode connection pattern formed on the passivation layer to connect the pixel electrode to the drain electrode via the exposed passivation layer;
a black matrix formed on the second substrate;
a color filter layer located between the black matrixes;
a column spacer formed on the second substrate corresponding to the protrusion pattern so as to be contactable with the protrusion pattern; and
a liquid crystal layer interposed between the first substrate and the second substrate,
wherein a distance between the second horizontal portion of the drain electrode and the protrusion pattern is longer than a distance between the first horizontal portion of the drain electrode and the protrusion pattern along the direction parallel to the data line.

2. The device of claim 1, wherein the gate insulating layer is formed on an entire surface of the substrate including the gate electrode.

3. The device of claim 1, wherein the transistor is a Thin Film Transistor.

4. The device of claim 1, wherein the protrusion pattern is formed on the gate insulating layer located above the gate line adjacent to the drain electrode.

5. The device of any one of claim 1, wherein the gate line has a perpendicular pattern overlapping the drain electrode to construct a parasitic capacitor.

6. A method for fabricating a liquid crystal display device comprising:
preparing a first substrate and a second substrate;
forming a plurality of gate lines aligned on the first substrate in one direction in parallel to each other, a gate electrode extending from each gate line, and a large pixel electrode;
forming a gate insulating layer on a surface of the substrate having the gate electrode;
forming a data line and a common line formed on the gate insulating layer to define pixel regions at intersecting points with the gate lines;
forming a transistor at the intersecting point between the gate line and the data line, the thin film transistor comprising an active layer on the gate insulating layer, a source electrode, and a drain electrode spaced apart from the source electrode and having a first horizontal portion, a second horizontal portion, and a bent portion between the first and second horizontal portions, and forming a protrusion pattern on the gate line to face the second horizontal portion of the drain electrode in a direction parallel to the data line;
forming a passivation layer formed on a surface of the first substrate having the protrusion pattern to expose the pixel electrode;
forming a plurality of branched common electrodes on the passivation layer, the branched common electrode being connected to the common line and overlapping the pixel electrode, and simultaneously forming a pixel electrode connection pattern on the passivation layer to connect the pixel electrode to the drain electrode;
forming a black matrix on the second substrate to define a non-pixel area;
forming a color filter layer on the second substrate corresponding to the pixel region between the black matrixes;
forming a column spacer on the second substrate corresponding to the protrusion pattern to be contactable with the protrusion pattern; and
forming a liquid crystal layer between the first substrate and the second substrate,
wherein a distance between the second horizontal portion of the drain electrode and the protrusion pattern is longer than a distance between the first horizontal portion of the drain electrode and the protrusion pattern along the direction parallel to the data line.

7. The method of claim 6, wherein the gate insulating layer is formed on an entire surface of the substrate.

8. The method of claim 6, wherein the transistor is a Thin Film Transistor.

9. The method of claim 6, wherein the transistor and the protrusion pattern are simultaneously formed.

10. The method of claim 6, wherein the protrusion pattern is formed on the gate insulating layer located above the gate line adjacent to the drain electrode.

11. The method of claim 6, wherein the gate line has a perpendicular pattern overlapping the drain electrode to construct a parasitic capacitor.

12. The device of claim 5, wherein the perpendicular pattern is parallel to the bent portion of the drain electrode.

13. The device of claim 5, wherein the protrusion pattern is disposed between the perpendicular pattern of the gate line and the bent portion of the drain electrode.

* * * * *